(12) United States Patent
Kubo et al.

(10) Patent No.: US 11,878,353 B2
(45) Date of Patent: Jan. 23, 2024

(54) DIAMOND-COATED ROTARY CUTTING TOOL

(71) Applicant: MITSUBISHI MATERIALS CORPORATION, Tokyo (JP)

(72) Inventors: Takuya Kubo, Naka (JP); Kazuhisa Murata, Akashi (JP); Akimitsu Tominaga, Akashi (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 889 days.

(21) Appl. No.: 16/651,488

(22) PCT Filed: Sep. 28, 2018

(86) PCT No.: PCT/JP2018/036204
§ 371 (c)(1),
(2) Date: Mar. 27, 2020

(87) PCT Pub. No.: WO2019/065949
PCT Pub. Date: Apr. 4, 2019

(65) Prior Publication Data
US 2020/0261985 A1 Aug. 20, 2020

(30) Foreign Application Priority Data
Sep. 29, 2017 (JP) .................. 2017-189702

(51) Int. Cl.
*C23C 28/04* (2006.01)
*B23B 27/20* (2006.01)
(Continued)

(52) U.S. Cl.
CPC .............. *B23B 27/20* (2013.01); *B23B 51/00* (2013.01); *B23C 5/10* (2013.01); *B23C 5/1009* (2013.01);
(Continued)

(58) Field of Classification Search
None
See application file for complete search history.

(56) References Cited

U.S. PATENT DOCUMENTS

| 9,868,160 B2 | 1/2018 | Osaki et al. |
| 2015/0117972 A1 | 4/2015 | Osaki et al. |
| 2017/0043406 A1 | 2/2017 | Waki |

FOREIGN PATENT DOCUMENTS

| EP | 2868413 A1 | 5/2015 |
| JP | H04-210315 A | 7/1992 |

(Continued)

OTHER PUBLICATIONS

Dumpala et al., "Engineered CVD Diamond Coatings for Machining and Tribological Applications", 2015, JOM (The Minerals, Metals & Materials Society), vol. 67, No. 7, p. 1565-1577. (Year: 2015).*

(Continued)

*Primary Examiner* — Humera N. Sheikh
*Assistant Examiner* — Kim S. Horger
(74) *Attorney, Agent, or Firm* — Locke Lord LLP; James E. Armstrong, IV; Nicholas J. DiCeglie, Jr.

(57) ABSTRACT

A diamond coating includes a first diamond layer made of minute diamond particles and a second diamond layer made of coarse diamond particles: in a flank-face side diamond coating, a mean coat thickness d2 is not less than 3 μm and not more than 25 μm, a first diamond layer is formed on a surface side and a second diamond layer is formed on a tool base side: a rake-face side diamond coating is in a smaller range of 50 μm or ¹⁄₁₀ of a tool diameter from a tip of a base cutting-edge part; in the rake-face side diamond coating, a mean coat thickness d1 is a smaller one in a range not less than 0 μm and not more than 5.0 μm or a range less than d2: and a boundary part between the first diamond layer and the second diamond layer.

4 Claims, 10 Drawing Sheets

(51) Int. Cl.
  *B23B 51/00* (2006.01)
  *B23C 5/10* (2006.01)
  *C23C 16/27* (2006.01)
(52) U.S. Cl.
  CPC .......... *C23C 16/271* (2013.01); *C23C 16/279* (2013.01); *B23C 2226/31* (2013.01)

(56) References Cited

FOREIGN PATENT DOCUMENTS

| | | | |
|---|---|---|---|
| JP | H08-99201 | A | 4/1996 |
| JP | 3477182 | B2 | 12/2003 |
| JP | 3477183 | B2 | 12/2003 |
| JP | 2005-279820 | A | 10/2005 |
| JP | 2007-307673 | A | 11/2007 |
| JP | 2010221352 | A * | 10/2010 |
| JP | 2012-176471 | A | 9/2012 |
| JP | 2015-85462 | A | 5/2015 |
| JP | 5764181 | B2 | 8/2015 |

OTHER PUBLICATIONS

Supplementary European Search Report dated Feb. 18, 2021, issued for European patent application No. 18861773.2.
International Search Report dated Jan. 8, 2019, issued for PCT/JP2018/036204.

* cited by examiner

[FIG. 1]
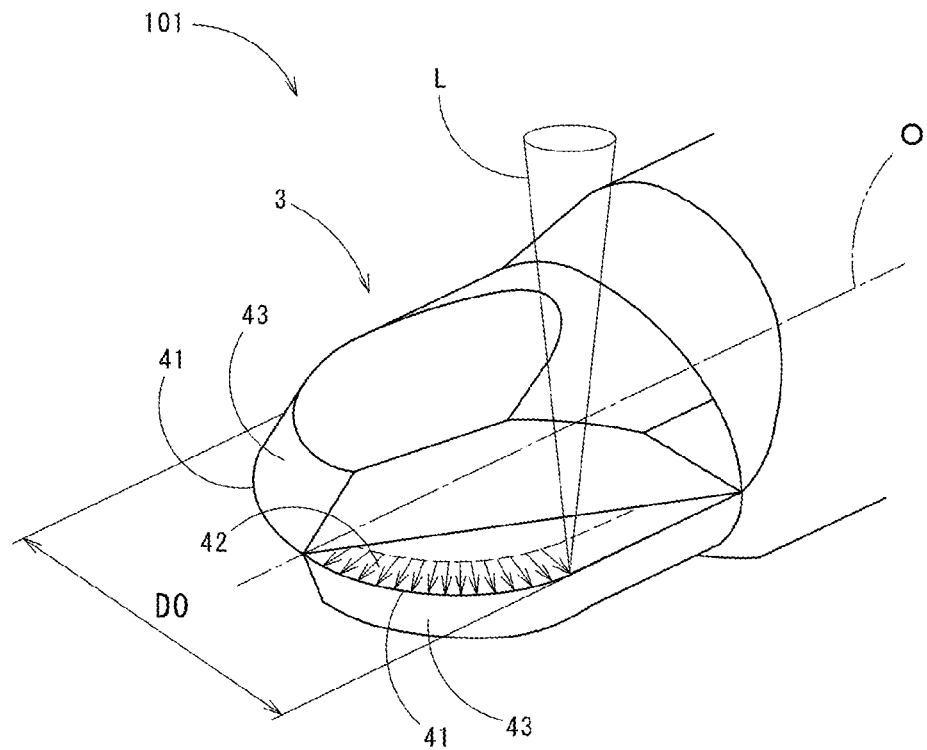
[FIG. 2]
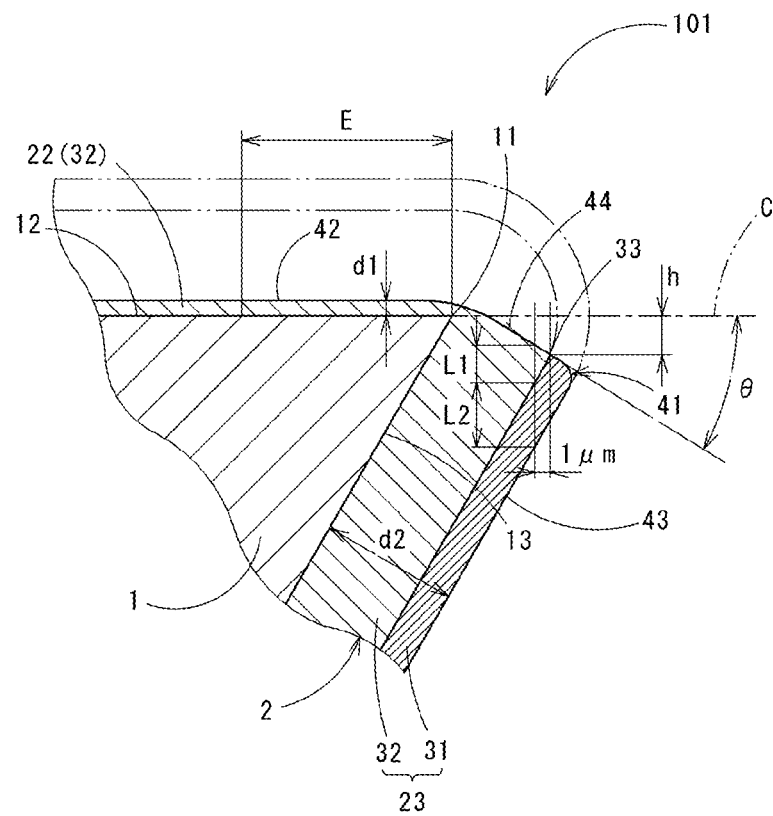

[FIG. 3]
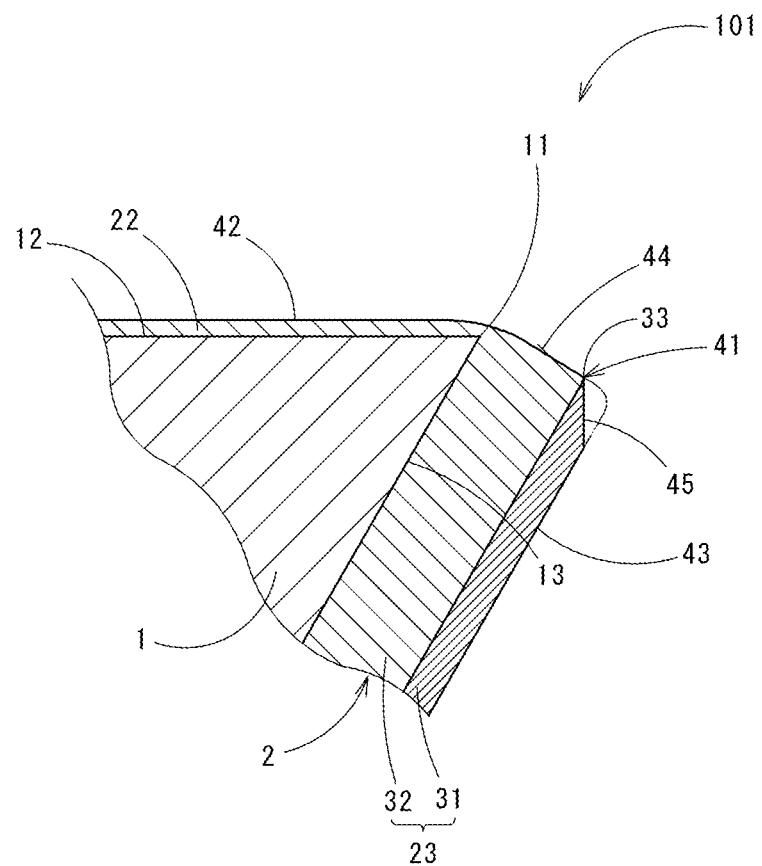
[FIG. 4]
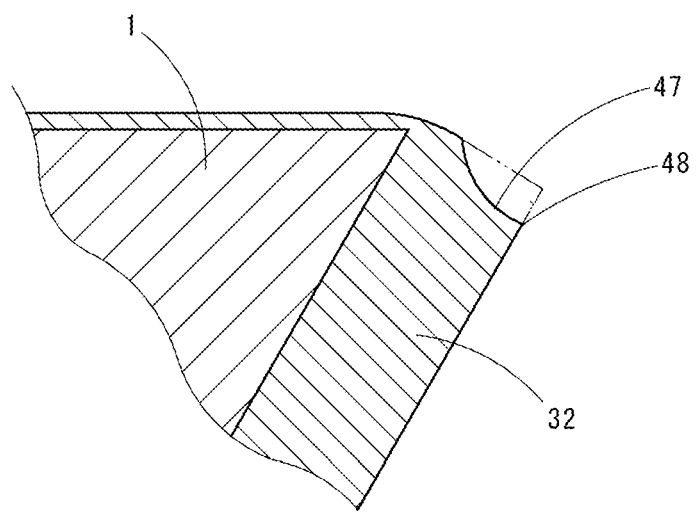

[FIG. 5]
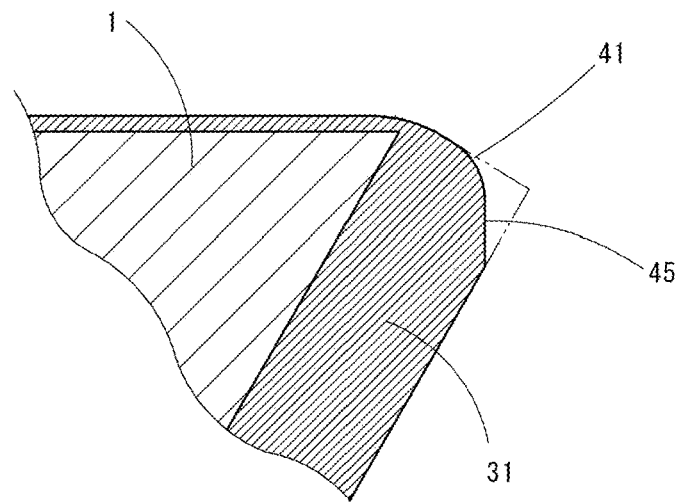
[FIG. 6]
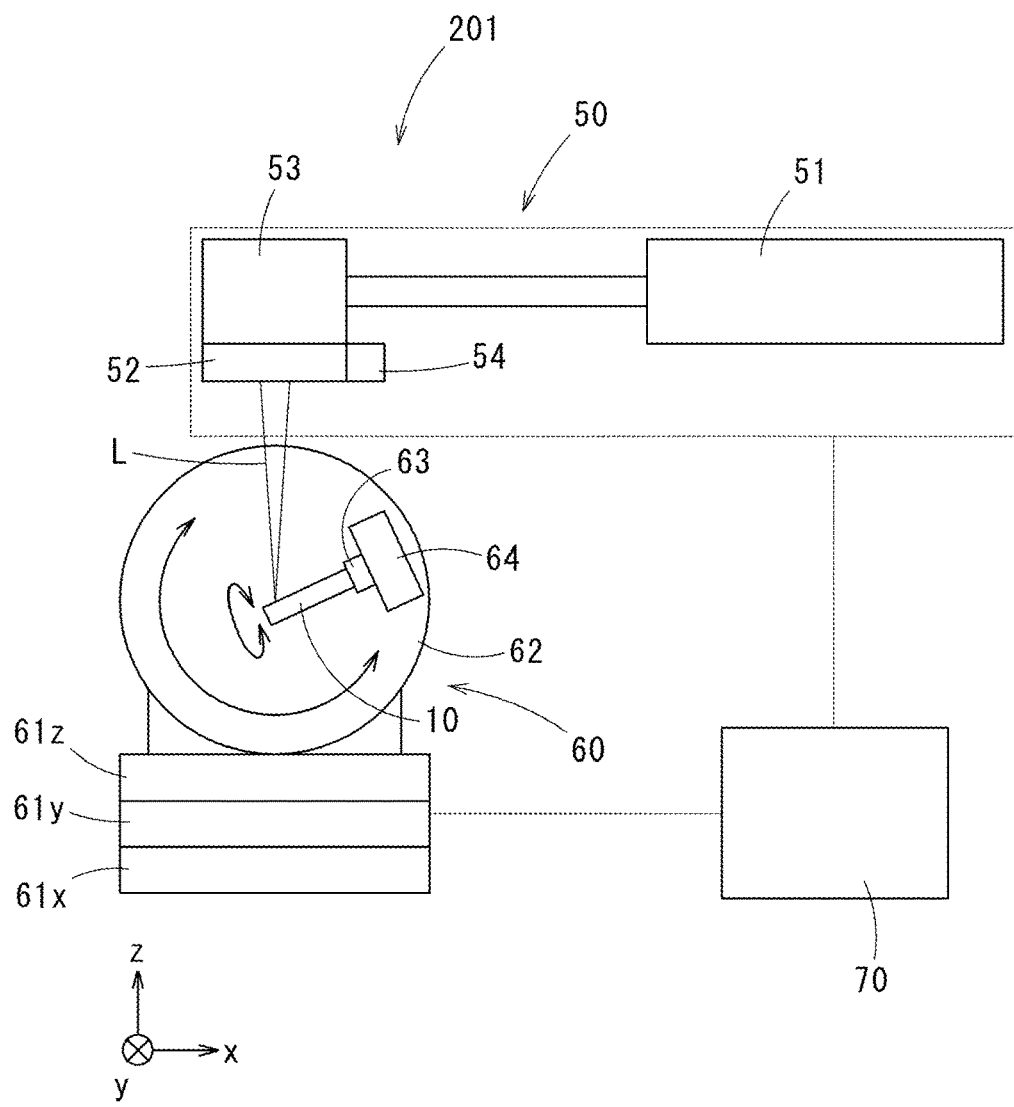

[FIG. 7]
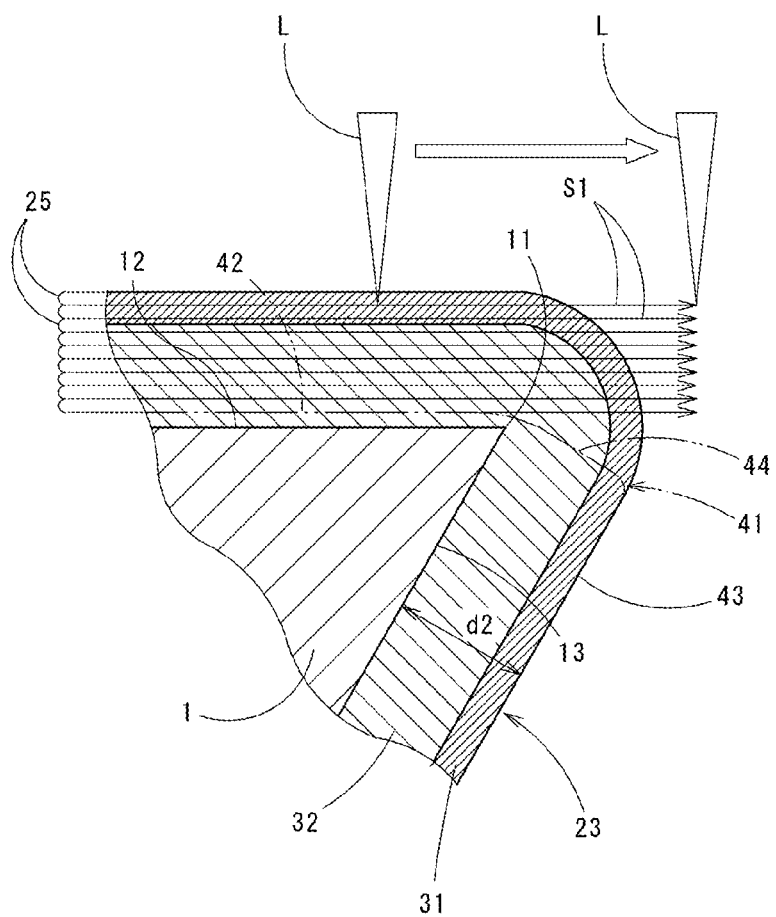

[FIG. 8]
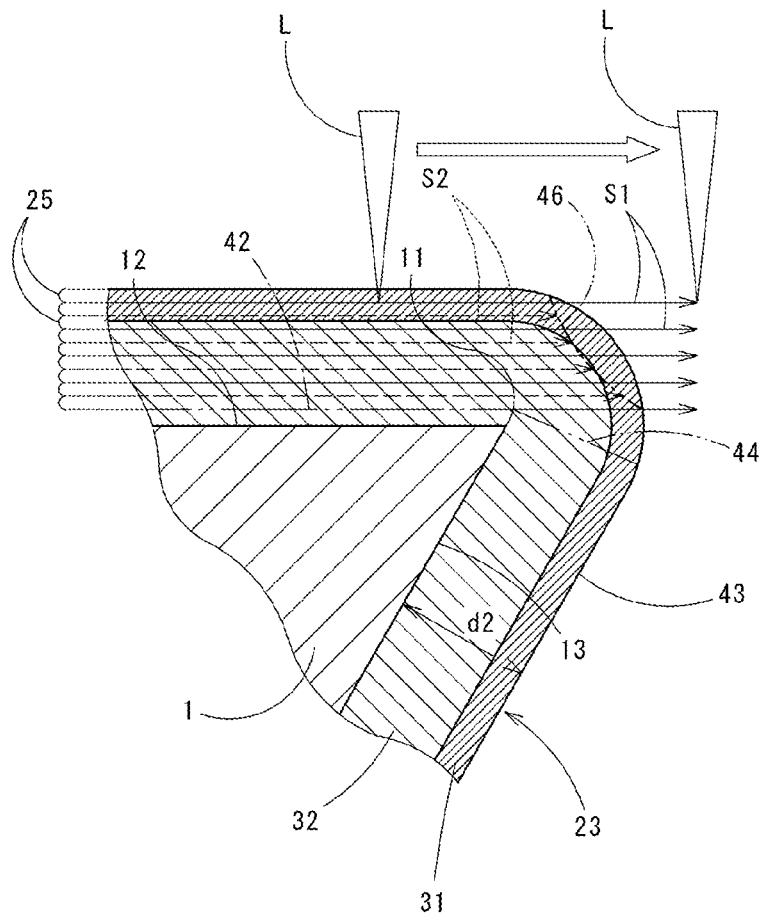
[FIG. 9]
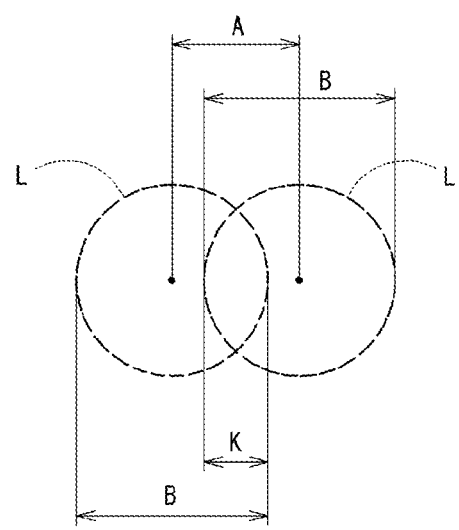

[FIG. 10]
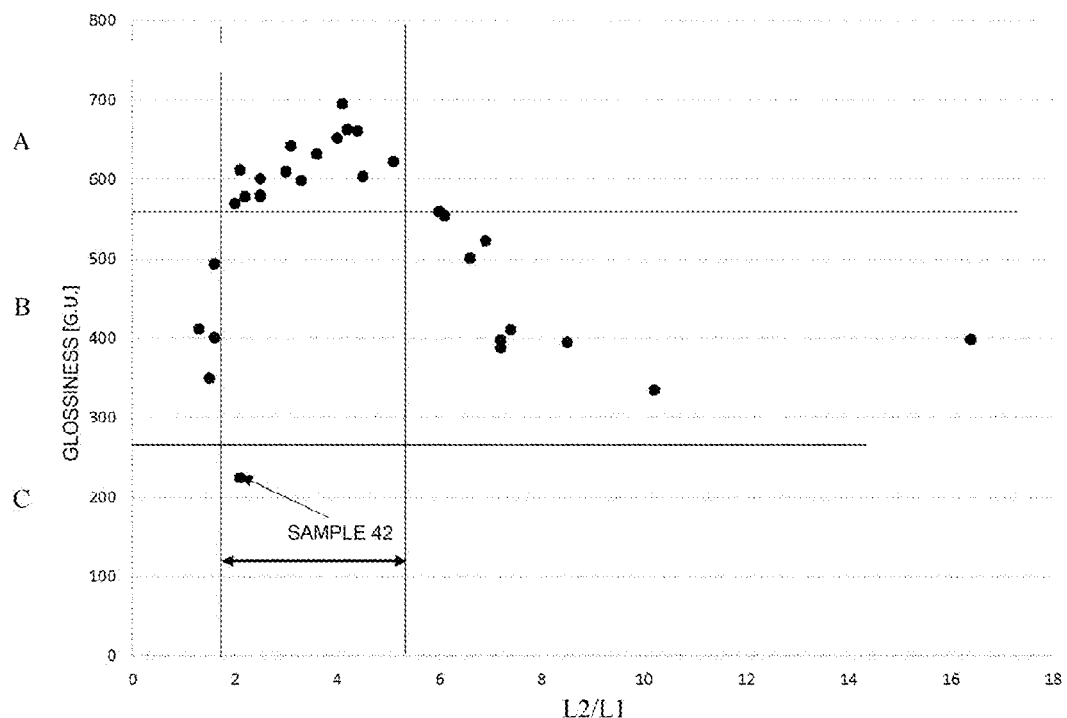
[FIG. 11A]
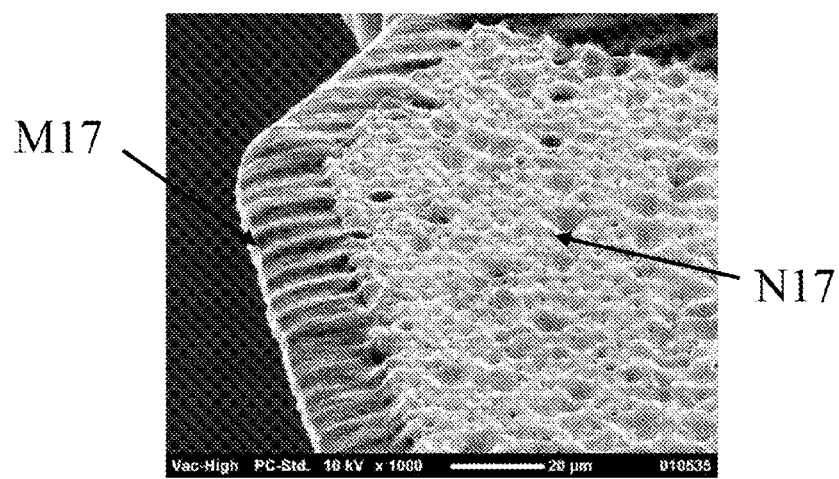

[FIG. 11B]
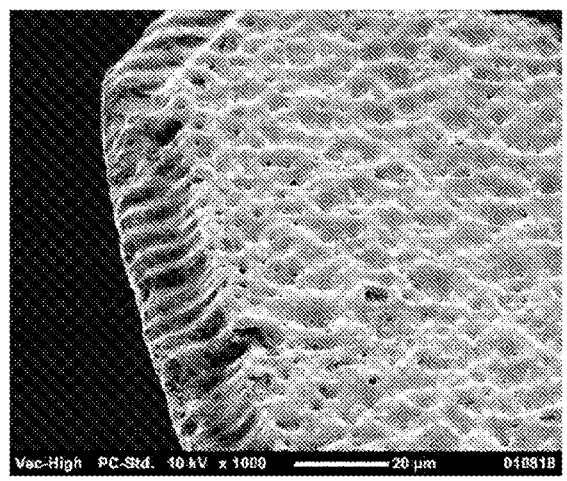
[FIG. 12A]
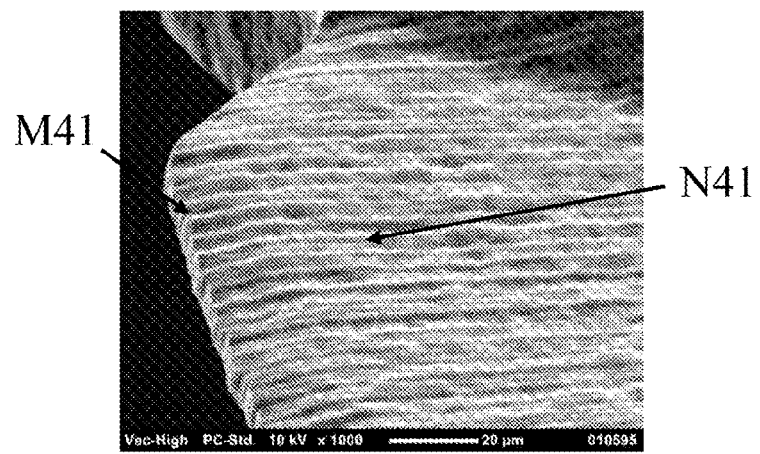

[FIG. 12B]
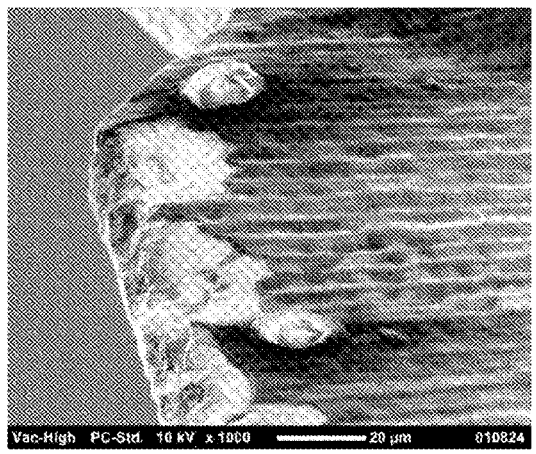
[FIG. 13A]
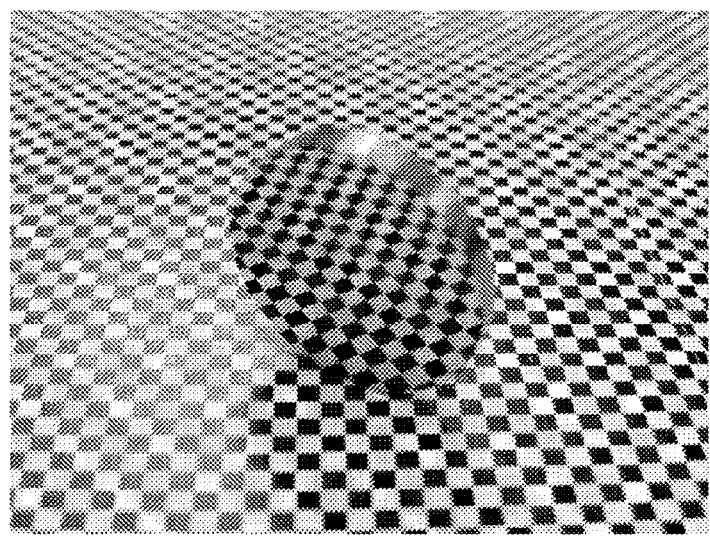

[FIG. 13B]
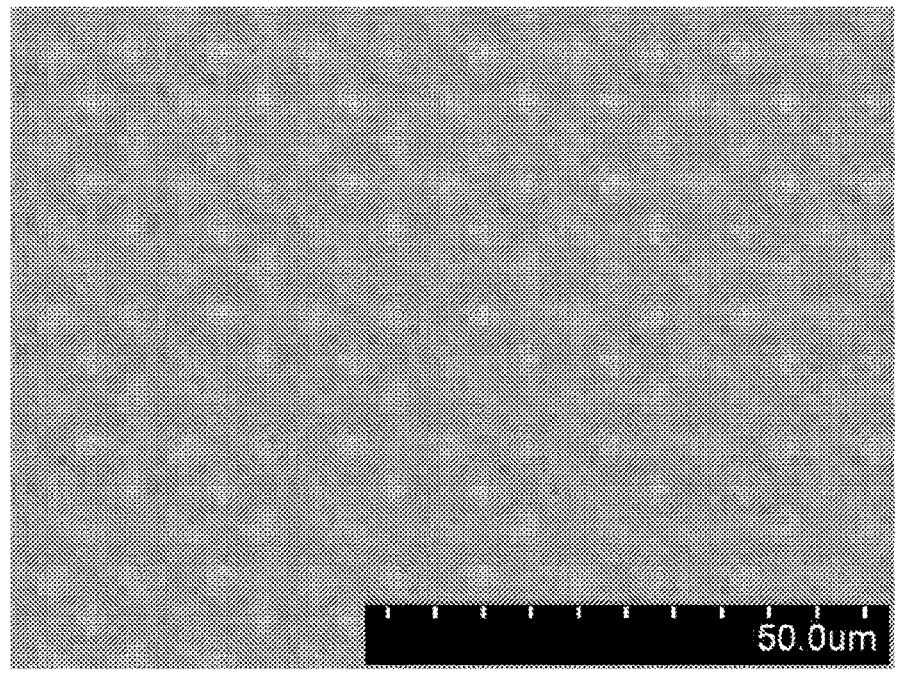
[FIG. 14A]
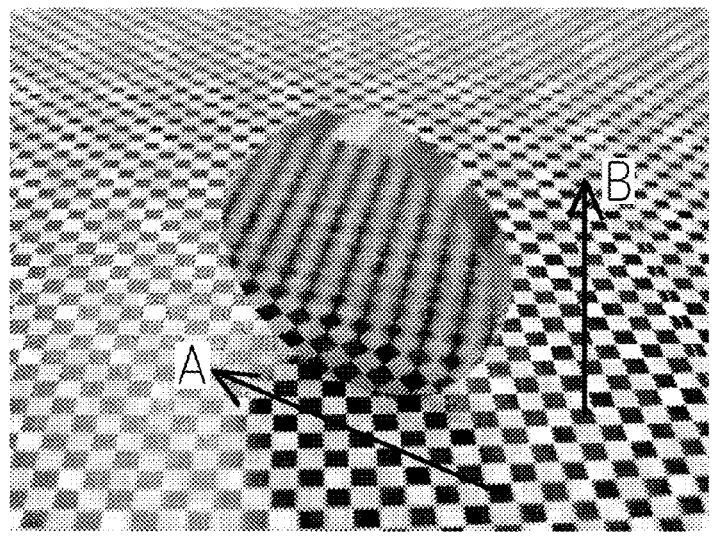

[FIG. 14B]
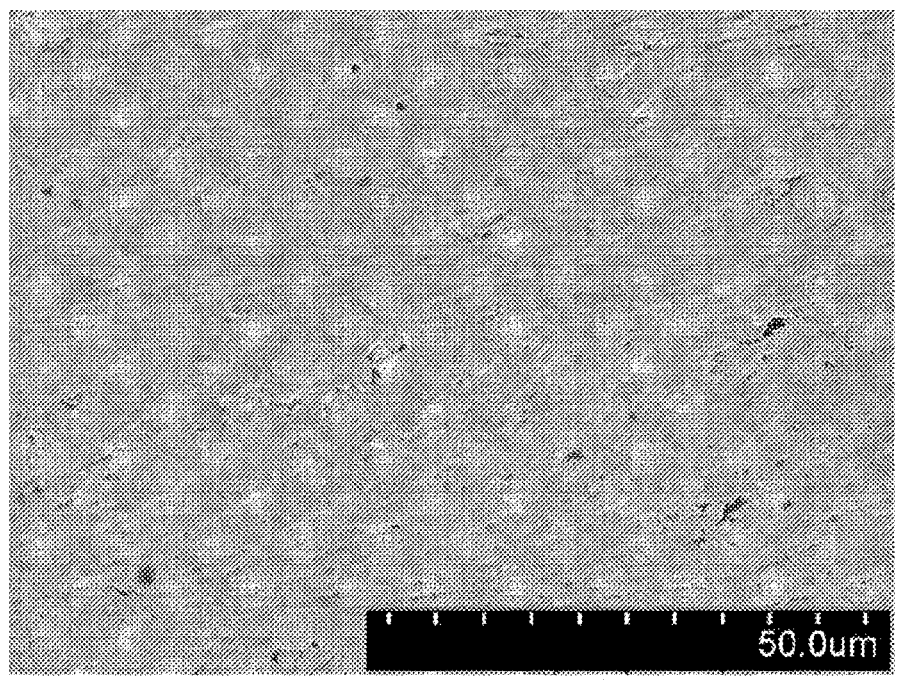

DIAMOND-COATED ROTARY CUTTING TOOL

BACKGROUND OF THE INVENTION

Technical Field

The present invention relates to a diamond-coated rotary cutting tool in which a surface of base made of hard metal (cemented carbide) is coated with diamond.

Priority is claimed on Japanese Patent Application No. 2017-189702, filed Sep. 29, 2017, the content of which is incorporated herein by reference.

Background Art

A rotary cutting tool in which a surface of a base made of hard metal (cemented carbide) is coated with diamond has an advantage of high strength at a cutting edge: however, there is a problem in which a machined surface is not easy to be flat and smooth, because the cutting edge is round in accordance with a film thickness of the diamond coating.

Regarding the problem in that the cutting edge of the tool gets round, methods and the like described in Patent Documents 1 to 4 are proposed for example.

In Patent Document 1, it is described to sharpen a cutting edge by planarly thinning a diamond coating of the cutting edge by polishing machining.

In Patent Document 2 and Patent Document 3, it is described that cutting quality of a blade is improved by forming a chamfer on a cutting edge.

In Patent Document 4, a method of reducing a curvature radius of a cutting edge by thinning a diamond coating on a rake face of a tool by laser machining.

CITATION LIST

Patent Literature

Patent Document 1: Japanese Unexamined Patent Application, First Publication No. H04-210315
Patent Document 2: Japanese Examined Patent Application, Second Publication No. 3477182
Patent Document 3: Japanese Examined Patent Application, Second Publication No. 3477183
Patent Document 2: Japanese Examined Patent Application, Second Publication No. 5764181

SUMMARY OF INVENTION

Technical Problem

However, even in these methods described in the above-mentioned Patent Documents, there is a problem of deterioration in a tool life; because chipping of the cutting edge easily occurring, or a pace of wearing back of the cutting edge by abrasion being increased since the diamond coating on the cutting edge is thinner than when it is untreated.

The present invention is achieved in consideration of the above circumstances, and has an object to provide a diamond-coated rotary cutting tool in which defects by peeling or chipping can be prevented and a flat and smooth machined surface can be obtained.

Solution to Problem

A diamond-coated rotary cutting tool of the present invention is a diamond-coated cutting tool including a tool base made of hard metal and a diamond coating which covers a surface thereof: the tool base is provided with a base rake-face, a base flank-face, and a base cutting-edge part formed between the base rake-face and the base flank-face: the diamond coating includes a first diamond layer formed from minute diamond particles and a second diamond layer formed from larger diamond particles than the diamond particles of the first diamond layer, and forms a flank-face side diamond coating and a rake-face side diamond coating, the flank-face side diamond coating is formed from a flank-face side diamond coating and a rake-face side diamond coating, the flank-face side diamond coating covers a surface of the base flank-face and has a mean coat thickness d2 not less than 3 μm and not more than 25 μm, and the rake-face side diamond coating has a mean coat thickness in a smaller one of a range d1 not less than 0 μm and no more than 5.0 μm or a range less than the mean coat thickness d2 and covers at least a prescribed region of the base rake-face: the flank-face side diamond coating is provided with the first diamond coating forming a surface thereof and the second diamond layer adjacent to the first diamond coating by a side of the tool base: the rake-face side diamond coating is formed at least in a smaller one of a region of 50 μm or a region of 1/10 of a tool diameter from the base cutting-edge part as the prescribed region on the base rake-face, and is provided with a tool rake-face formed by a surface of the rake-face side diamond coating or a surface of the base rake-face and a following end surface of the flank-face side diamond coating, a tool flank-face formed by the surface of the flank-face side diamond coating, and a tool cutting-edge part formed on a ridge where the tool rake-face and the tool flank-face cross: in a perpendicular cross section of the base cutting-edge part, a base line is a straight line connecting a tool rotation axis and the base cutting-edge part, and a boundary part between the first diamond layer and the second diamond layer on the end surface of the flank-face side diamond coating is exposed at a side near the base rake-face of an extended line of the base line.

In this diamond-coated rotary cutting tool, a lip (a cutting edge) of the tool cutting-edge part is formed by a tip of the first diamond layer of the flank-face side diamond coating in an initial step.

Although a part of the first diamond layer is worn off by cutting, this wear abrasion advances without chipping or the like since it is a layer formed from minute diamond particles. Since the second diamond layer is provided adjacent to the first diamond layer at the base side, the boundary part between the first diamond layer and the second diamond layer becomes a cutting edge of the tool cutting-edge part when the first diamond layer is worn off to the boundary part of the second diamond layer.

After that, the wear rate is remarkably reduced because the diamond particles of the second diamond layer are large and have high wear resistance.

Meanwhile, the tool cutting-edge part of a side near to the flank face than the lip (the cutting edge) is thinly coated by the first diamond layer formed of minute diamond particles: the first diamond layer is opposite at a surface thereof to the cutting workpiece.

In the lip (the cutting edge) of the tool cutting-edge part, the second diamond layer is not easily worn off but the wear rate of the first diamond layer thinly coating the side near to the flank face is large: accordingly, by continuing to cut in this state, an effect of self-sharpening in which the abrasion advances while maintaining a sharp cutting edge form is obtained, so that it is possible to maintain the cutting edge which can obtain a smooth machined surface for long term.

Moreover, even after the wear abrasion of the first diamond layer reaches the boundary part of the second diamond layer, since a principal force added on the tool cutting-edge part while cutting is divided to the second diamond layer at the lip of the tool cutting-edge part and the first diamond layer at the side near to the flank face, the chipping of the second diamond layer at the lip of the tool cutting-edge part does not easily occur.

In this case, in a smaller range of a region 50 μm or a region 1/10 of the tool diameter from the tip of the base cutting-edge part, the mean coat thickness d1 of the rake-face side diamond coating is in a smaller one of a range not less than 0 μm and not more than 5.0 μm or a range not less than 0 μm and less than the mean coat thickness d2 of the flank-face side diamond coating: accordingly, peelings of the rake-face side diamond coating can be prevented and good machining accuracy can be maintained.
In addition, the rake-face side diamond coating includes a state in which it is not formed so as to expose the base rake-face (the thickness of the rake-face side diamond coating is 0 μm).

In machining of the cutting workpiece, the tool flank-face is easier to be in contact with the cutting workpiece comparing to the tool rake-face even at a position separated from the lip of the tool cutting-edge part, and it is easy to be worn off by sliding on the cutting workpiece.
Accordingly, by maintaining the flank-face side diamond coating to have the mean coat thickness d2 not less than 3 μm and not more than 25 μm, the peeling of the flank-face side diamond coating can be prevented and the tool life can be prevented from deterioration.

If the mean coat thickness d2 of the flank-face side diamond coating is less than 3 μm, the tool flank-face is worn off earlier than the tool rake-face, and the tool life is deteriorated.
Meanwhile, if the mean coat thickness d2 is more than 25 μm, the diamond coating is easy to be self-destructed.

As a preferred embodiment of the diamond-coated rotary cutting tool of the present invention, it is preferable that, on a perpendicular line to the base line at a position of 1 μm in a parallel direction to the base line from the boundary part to the tool base side, a ratio (L2/L1) of a length L1 of the second diamond layer and a length L2 of the first diamond layer satisfy 2≤(L2/L1)≤6.

If (L2/L1) is less than 2, the thickness of the first diamond layer coating the second diamond layer is small, and the above-described effect of self-sharpening is poor. If (L2/L1) is more than 6, the thickness of the first diamond layer is relatively large, and the abrasion is intense.

As a preferred embodiment of the diamond-coated rotary cutting tool of the present invention, it is preferable that a mean particle size of diamond particles of the first diamond layer be less than 0.15 μm; and a mean particle size of diamond particles of the second diamond layer be not less than 0.15 μm.

As a preferred embodiment of the diamond-coated rotary cutting tool of the present invention, it is preferable that where a length (a) is along a perpendicular direction to the surface of the tool base and a length (b) is along a parallel direction to the surface of the tool base and a length ratio (a/b) is a rate of the lengths (a) and (b) of the respective diamond particles observed on a cross section perpendicular to the surface of the tool base: the length ratio (a/b) of the diamond particles of the first diamond layer be less than 1.5, and the length ratio (a/b) of the diamond particles of the second diamond layer be not less than 1.5.

As a preferred embodiment of the diamond-coated rotary cutting tool of the present invention, in a wave-form separation of Raman spectrum on a cross section of the diamond coating perpendicular to the surface of the tool base, an intensity (d) is a sharp peak (d band) coming from a $sp^3$ hybrid orbital of diamond existing around 1332 $cm^{-1}$, and an intensity (G) is a gentle peak (G band) coming from a sp3 hybrid orbital of graphite existing around 1580 $cm^{-1}$, it is preferable that an intensity ratio (d/G) of the first diamond layer satisfy 0.1≤(d/G)≤0.8, and the intensity ratio (d/G) of the second diamond layer satisfy 0.8≤(d/G).

Advantageous Effects of Invention

According to the diamond-coated rotary cutting tool of the present invention, it is possible to prevent defects by peeling or chipping from occurring, and a smooth machined face can be obtained.

BRIEF DESCRIPTION OF DRAWINGS

FIG. 1 It is a perspective view showing a tool-tip part in a ball-end mill of an embodiment according to the present invention.

FIG. 2 It is a cross sectional view of a principal part showing a cross section perpendicular to a base cutting-edge part in a vicinity of a tool cutting-edge part of the ball-end mill shown in FIG. 1.

FIG. 3 It is a cross sectional view of a principal part showing a state in which a part of a flank-face side diamond coating is worn off in the tool cutting-edge part of the ball-end mill of the embodiment of the present invention shown in FIG. 2.

FIG. 4 It is a cross sectional view of a principal part showing a chipping in a case in which a diamond coating is formed from a single second diamond layer.

FIG. 5 It is a cross sectional view of a principal part showing a worn-off state of the cutting edge in a case in which a diamond coating is formed from a single first diamond layer.

FIG. 6 It is a general configuration of a laser machining device used for manufacturing the ball-end mill according to the present embodiment.

FIG. 7 It is a schematic view explaining a laser machining process in a case in which a rake-face side diamond coating is machined.

FIG. 8 It is a schematic view explaining a laser machining process in a case in which a cutting-edge rake-angle is changed.

FIG. 9 It is a schematic view explaining an overlap of laser beams.

FIG. 10 It is a graph showing a relation between a ratio (L2/L1) of film thicknesses at a specific position of the first diamond layer and the second diamond layer and glossiness of a cutting workpiece.

FIG. 11A It is an SEM image showing a state of the tool cutting-edge part of Example before a cutting test.

FIG. 11B It is a SEM image showing a state of the tool cutting-edge part of Example after the cutting test.

FIG. 12A It is an SEM image showing a state of a tool cutting-edge part of Comparative Example before a cutting test.

FIG. 12B It is an SEM image showing a state of the tool cutting-edge part of Comparative Example after the cutting test.

FIG. 13A It is a photograph of the whole cutting workpiece cut by the tool of Example.

FIG. 13B It is an SEM image of a magnified surface of the cutting workpiece cut by the tool of Example.

FIG. 14A It is a photograph of the whole cutting workpiece cut by the tool of Comparative Example.

FIG. 14B It is an SEM image of a magnified surface of the cutting workpiece cut by the tool of Comparative Example.

DESCRIPTION OF EMBODIMENTS

The present invention is applied on rotary cutting tools (drills, end mills, inserts or the like) having a diamond coating on a surface of a tool base. Below, embodiments of the present invention will be explained referring the drawings.

A diamond-coated rotary cutting tool 101 of a present embodiment is provided with a tool base 1 and a diamond coating 2 which coats a surface thereof as shown in FIG. 2: as shown in FIG. 1, it is a two-flute ball-end mill 101 having a tool-tip part 3 rotated around an axis O, and a pair of tool cutting-edge parts 41 are provided at the tool-tip part 3 on 180° opposite sides with the axis O therebetween.

The ball-end mill 101 is a small-diameter rotary cutting tool in which a tool diameter DO (an outer diameter, a nominal diameter) of the tool-tip part 3 is 0.1 mm to 2.0 mm inclusive.

As shown in FIG. 1, the tool cutting-edge parts 41 are formed on a ridge where a tool rake face 42 and a tool flank face 43 intersect.

The tool cutting-edge parts 41, the tool rake faces 42, and the tool flank faces 43 are rotational symmetrically arranged at two part with the axis O of the ball end mill 101 as an axis of symmetry.

The tool base 1 is formed from hard metal (cemented carbide).

The diamond coating 2 is formed by a hot filament CVD method (a chemical vapor deposition method) or the like.

As shown in FIG. 2, the tool base 1 has a base rake face 12, a base flank-face 13, and a base cutting-edge part 11 formed on a ridge where the base rake face 12 and the base flank-face 13 intersect.

FIG. 2 is a perpendicular cross-sectional view (a cross sectional view perpendicular to a surface of the tool base 1) at a certain point on the base cutting-edge part 11.

The diamond coating 2 coating the surface of the tool base 1 includes a rake-face side diamond coating 22 coating at least a prescribed region of the surface of the base rake face 12, and a flank face side diamond coating 23 coating the surface of the base flank-face 13.

An average film thickness d2 of the flank face side diamond coating 23 is 3 μm to 25 μm inclusive.

The flank face side diamond coating 23 is formed from a first diamond layer 31 and a second diamond layer 32: the first diamond layer 31 is made of minute diamond particles (minute diamond particles) forming a surface thereof; and the second diamond layer 32 is arranged at the tool base 1 side adjacent to the first diamond layer 31, and made of larger diamond particles (coarse diamond particles) than the diamond particles of the first diamond layer 31.

The rake face diamond coating 22 is formed from a single layer of the second diamond layer 32, and covers a region E (the region denoted by a symbol "E" in FIG. 2) on the base rake face 12 as a prescribed region: the region E is a region from the base cutting-edge part 11, smaller one of 50 μm or 1/10 of the tool diameter DO.

The average film thickness d1 of the rake-face side diamond coating 22 is in a range that is smaller one of a range 0 μm to 5.0 μm inclusive or a range 0 μm to less than the average film thickness d2 of the flank face side diamond coating 23.

The rake-face side diamond coating 22 may have the film thickness d1 zero, so that the base rake face 12 may be exposed.

The minute diamond particles of the first diamond layer 31 are so-called "nanodiamonds": the coarse diamond particles of the second diamond layer 32 are "columnar crystal diamond".

Generally, in the CVD hot filament method, the nanodiamonds are rapidly changed to the columnar crystal diamond in a certain threshold range when a gas condition for forming films is changed in stages.

It is known that a gradation layer in which a mean particle size changes from nano-order to micro-order can be formed in a few μm thickness by gradually changing the gas condition in the threshold range spending a few hours.

A boundary part 33 between the first diamond layer 31 and the second diamond layer 32 may be a gradation layer also in the present embodiment.

If the boundary part 33 is the gradation layer, it is expected that a smoother machined surface can be obtained by reducing unevenness of a boundary face between the first diamond layer 31 and the second diamond layer 32.

However, an effect of self-sharpening is reduced if a thickness of the gradation layer is excessively large, so that it is desired that the thickness of the gradation layer be in a smaller range than about 0 to 3 μm.

In addition, when the gradation layer is provided, a center of the gradation layer is defined as the boundary part between the first diamond layer and the second diamond layer.

In the ball-end mill 101, in the perpendicular cross section (FIG. 2) of the base cutting-edge part 11, when a straight line connecting a tool-rotation axis (the axis O) and the base cutting-edge part 11 is a base line C, on a perpendicular line to the base line C at a portion 1 μm near to the tool base 1 in a parallel direction to the base line C from the boundary part 33, it is desirable that a ratio (L2/L1) where a length L1 of the second diamond layer and a length L2 of the first diamond layer be 2≤(L2/L1)≤6.

(L2/L1) is not smaller than 2, so that the thickness of the first diamond layer 31 covering the second diamond layer 32 is enough, and the effect of self-sharpening can be obtained. (L2/L1) is not more than 6, so that the relative thickness of the first diamond layer 31 is not excessively large, and abrasion can be reduced.

Focusing on the particle sizes of the diamond particles of the respective layers, it is preferable that the minute diamond particles of the first diamond layer 31 have a mean particle size of less than 0.15 μm, and the coarse diamond particles of the second diamond layer 32 have a mean particle size of not less than 0.15 μm.

Focusing on aspect ratios of the diamond particles in the respective layers, regarding the each diamond particle observed in a cross section perpendicular to the surface of the tool base 1, where a length in a perpendicular direction to the surface of the tool base 1 is (a) and a length in a parallel direction to the surface of the tool base 1 is (b), it is preferable that a length ratio (a/b) of the diamond particles of the first diamond layer 31 be less than 1.5, a length ratio (a/b) of the diamond particles of the second diamond layer 32 be not less than 1.5.

Normally, the aspect ratio of the columnar crystal diamond particle is far higher than the aspect ratio of the nanodiamond particle.

In accordance with the above-mentioned setting of lengths (a) and (b), a thickness of a columnar crystal diamond layer might be an upper limit of a length (a) of a major axis of the columnar crystal diamond particles: accordingly, in a case in which it is formed by the hot filament CVD method, depending on the thickness of layers, there is a case in which the aspect ratio of the columnar crystal diamond in which the length (a) of a minor length is large might be small as 1.

The length ratio (a/b) of the diamond particles of the second diamond layer 32 is preferably not less than 1.5 in the present embodiment.

From Raman spectrum obtained by Raman spectroscopy, the first diamond layer 31 and the second diamond layer 32 can be compared in crystallinity.

Specifically, an intensity ratio (d/G) of the first diamond layer 31 is preferably 0.1≤(d/G)≤0.8, and an intensity ratio (d/G) of the second diamond layer 32 is preferably 0.8≤(d/G): regarding the intensity ratio (d/G), in a wave-form separation of the Raman spectrum on a cross section of the diamond coating 2 which is cut off in a perpendicular direction to the surface of the tool base 1, an intensity (d) is a sharp peak (d band) coming from a $sp^3$ hybrid orbital of diamond existing around 1332 $cm^{-1}$ and an intensity (G) is a gentle peak (G band) coming from a sp3 hybrid orbital of graphite existing around 1580 $cm^{-1}$ is the intensity ratio (d/G).

The intensity ratio (d/G) is one of ordinary parameter often used for evaluating a film quality of a diamond coating: it means that the crystallinity is higher if the intensity ratio (d/G) is higher.

It is known that if the intensity ratio (d/G) is higher in a polycrystalline diamond coating, crystals are coarsened and columnarized, wear resistance is improved, defect resistance is deteriorated, and surface roughness is increased.

The rake-face side diamond coating 22 is formed from a single layer of the second diamond layer 32 covering the base rake-face 12 on a prescribed region that is a region (a region shown by the symbol E in FIG. 2) smaller one of 50 μm or ⅒ of the tool diameter DO from the base cutting-edge part 11.

The flank-face side diamond coating 23 is a double-layered structure of the first diamond layer 31 and the second diamond layer 32.

At a tip of the base cutting-edge part 11, an end face of the flank-face side diamond coating 23 is connected to the surface of the rake-face side diamond coating 22.

Accordingly, the surface of the rake-face side diamond coating 22 and the end face of the flank-face side diamond coating 23 (the first diamond layer 31 and the second diamond layer 32) form the tool rake-face 42: the flank-face side diamond coating 23 and the surface of the first diamond layer 31 form the tool flank-face 43: and between the tool rake-face 42 and the tool flank-face 43 the tool cutting-edge part 41 is formed.

Accordingly, the tool flank-face 42 is mostly formed from the second diamond layer 32.

In the vicinity of the tool cutting-edge part 41, the end face of the second diamond layer 32 and the end face of the first diamond layer 31 are connected, and the boundary part 33 of them is exposed.

When the straight line connecting the tool-rotation axis (the axis O) of the ball-end mill 101 and the base cutting-edge part 11 is the base line C, the boundary part 33 between the first diamond layer 31 and the second diamond layer 32 of the flank-face side diamond coating 23 is exposed at the base flank-face 13 side than an extended line of the base line C.

Specifically, in the cross section shown in FIG. 2, when a height from the base line C to the boundary part 33 between second diamond layer 32 and the first diamond layer 31 of the flank-face side diamond coating 23 is "h", the height "h" is a positive value (+: plus) in the tool rake-face 42 side than the base line C and a negative value (−: minus) in the tool flank-face 43 side: it is provided so that the height "h" is negative (h<0 μm).

The reason why the height "h" of the exposed boundary part 33 is negative is the cutting quality is deteriorated if the height "h" is positive, because a portion of the cutting edge which is rounded when the film is formed is most deeply in contact with a work when abrasion reaches the boundary part 33.

A rake angle θ (an angle between the base line C and a tangent line at the boundary part between the diamond layers 31 and 32) at the boundary part 33 between the first diamond layer 31 and the second diamond layer 32 in the tool cutting-edge part 41 of an unused tool is preferably −20°<θ<−5° when the value is positive (+: plus) at a side of the tool rake-face 42 and negative (−: minus) at a side of the tool flank-face 43 from the base line C.

Hereinafter, the rake angle θ is a cutting-edge rake-angle; and a surface formed by an end surface of the flank-face side diamond coating 23 is a cutting-edge rake-face 44.

In the ball-end mill 101 of the present embodiment, the reason why the rake-face side diamond coating 22 is flat and thin is as follows.

Generally, in a case in which hard brittle material such as hard metal (cemented carbide) is machined using a diamond-coated cutting tool, damage called flaking may occur on a cutting edge because a large back force is added on the cutting edge of a tool cutting-edge part while cutting.

In this case, it is known that the diamond coating on a rake face tends to be largely peeled and there may be problems of occurring steps on a machined face before and after the peeling.

In this regard, in the tool of the present embodiment, the peeling is prevented by thinning the film thickness of the rake-face side diamond coating 22.

In diamond-coated tools, there is a character in which peelings from a boundary surface of a base not easily occur if the thickness of the coating is thinner; and the tool of the present embodiment in which the cutting edge is sharpened is less added the back force than untreated, so that the flaking itself is also reduced.

When performing cutting by the ball-end mill 101 structured as above, as shown in FIG. 3, the first diamond layer 31 having low wear resistance at the tip of the flank-face side diamond coating 23 is worn away in an earlier step of an initial stage of cutting.

When the abrasion reaches the boundary part 33 with the second diamond layer 32, since the second diamond layer 32 has the high wear resistance, a wear rate of the whole cutting edge of the tool cutting-edge part 41 is drastically reduced.

When abrasion is further progressed, since the wear rate at the first diamond layer 31 at the flank face side is larger that of the second diamond layer 32 at a corner of the tool tip, the effect of self-sharpening in which the abrasion progresses while a sharp shape is maintained is produced, so it is possible for long term to maintain the cutting edge by which the smooth machined face can be obtained.

In the shape of the cutting edge of the tool cutting-edge part 41 shown in FIG. 3, since a principal force which is added on the cutting edge while cutting is decomposed to the second diamond layer 32 forming the cutting-edge rake face 44 at a corner part of the cutting edge and the first diamond layer 31 at the flank face side, chipping of the second diamond layer 32 at the corner part of the cutting edge is not easily occurred.

In the first diamond layer 31 of the flank-face side diamond coating 23 which is worn out to the state shown in FIG. 3, the surface formed in the vicinity of the tool cutting-edge part 41 is a cutting-edge flank-face 45.

As comparison, in a case in which a single film of the second diamond layer 32 is used in the same shape of the cutting edge as shown in FIG. 4, since the defect resistance is low in the second diamond layer 32, damages as follows are repeated: a chipped part 47 arises at the sharp tip edge by chipping, and chipping arises again at a new projection 48 generated in this manner.

Accordingly, a damaging rate of the cutting edge is large and minute scratches like tool paths are generated on the machined face.

In a case in which the same shape of the cutting edge is formed from the single film of the first diamond layer 31 as shown in FIG. 5, even though the chipping does not easily arise since the first diamond layer 31 is high in the defect resistance, a normal abrasion rate is large and a corner part of a tool cutting-edge part 41 cutting in works is worn out faster than a cutting-edge flank-face 45: the cutting edge at a tip of the tool cutting-edge part 41 rounds with progress of the abrasion.

Accordingly, cutting resistance is high, and tears and cracks arise on a surface of the work resulting from tensile stress on the surface of the work.

Next, a method of manufacturing the ball-end mil (the diamond-coated rotary cutting tool) 101 of the present embodiment will be explained.

The manufacturing method of the ball-end mill 101 of the present embodiment includes a step of film formation forming the diamond coating 2 on the surface of the tool base 1 made of hard metal, and a step of laser beam machining forming the tool cutting-edge part 41 by processing the diamond coating 2 by emitting laser beam L on the diamond coating 2.

«Step of Film Formation»

In the step of film formation, as shown in FIG. 7, formed on the surface of the tool base 1 is the diamond coating 2 with a double-layered structure having different average grain diameters respectively at a substantially constant film thickness (an average thickness d2), e.g., 8 μm to 30 μm inclusive: the tool base 1 has the base rake-face 12, the base flank-face 13 and the base cutting-edge part 11 formed between the base rake-face 12 and the base flank-face 13.

First, the second diamond layer 32 formed from diamond particles having large crystal grain diameter is formed on the tool base 1, and then the first diamond layer 1 formed from diamond particles having smaller crystal grain diameter than that of the second diamond layer 32 is formed over the second diamond layer 32.

For forming the diamond coating 2 on the tool base 1, known methods can be suitably applied, for example, a microwave plasma CVD method, the hot filament CVD method, an RF plasma CVD method, and the like.

Moreover, it is also possible to apply the other film formation methods such as an ion beam method and the like.

The crystal grain diameter can be controlled by changing gas conditions while forming films if it is the hot filament CVD method.

«Step of Laser Beam Machining»

In the step of laser beam machining, for example, a laser beam machining device 201 shown in FIG. 6 is used, the laser beam L is emitted on the diamond coating 2 so as to cover the surface of the tool base 1, and the diamond coating 2 is processed.

Hereinafter, in the description regarding FIG. 6 and the step of laser beam machining, a piece of work in which the diamond coating 2 is formed on the tool base 1 is denoted by the symbol 10.

For example, the laser beam machining device 201 is provided with a laser beam emission system 50 emitting the laser beam L by pulsed oscillation and scanning on the diamond coating 2 with a certain repetition frequency, a tool holder system 60 which can rotate, revolve and move the work 10 in xyz-axis directions respectively in a state of holding it on which the diamond coating 2 is coated, and a control system 70 controlling them.

The tool holder system 60 has a system of rotating, revolving and moving the work 10 in translationally in the respective x-y-z directions.

Specifically, provided are an x-axis stage part 61x which can move along a direction of the x axis parallel to a horizontal plane; a y-axis stage part 61y which is provided on the x-axis stage part 61x, movable along a direction of the y axis perpendicular to the x axis and parallel to the horizontal plane; a z-axis stage part 61z which is provided on the y-axis stage part 61y, movable along a direction perpendicular to the horizontal plane; a revolving system 62 which is provided on the z-axis stage part 61z; and a rotation system 64 fixed on the revolving system 62, rotating a holder 63 which can hold the work 10 around an axis perpendicular to a revolving axis of the revolving system 62.

These stage parts 61x to 61z, the revolving system 62, and the rotation system 64 have driving to parts using a stepping motor for example, and can feed back phases to the control system 70 by an encoder.

The laser beam emission system 50 is provided with a laser oscillator 51 pulse-oscillating the laser beam L by a Q-switching; a condensing lens 52 condensing the laser beam L in a spot; a beam scanning system 53 such as a galvanoscanner scanning the laser beam from the condense lens 52; and a photographing part 54 taking pictures of an emitting position of the laser beam L.

The laser oscillator 51 can use a light source which can emit the laser beam L of short wavelength 190 nm to 1100 nm; for example, in the present embodiment used can oscillate and emit laser beam of wavelength 355 nm (Nd: the third higher harmonic of YAG laser wave).

The beam scanning system 53 is arranged right above the tool holder system 60.

The control system 70 controls operations of the whole systems, having a program of setting a radius of a revolving orbit of the laser beam L, a wait time in the revolving orbit as stated below, and the like.

Next, explained is a method of forming the tool rake-face 42 in a region on the base rake-face 12, the tool flank-face 43 in a region on the base flank-face 13, and the tool cutting-edge part 41 between the tool rake-face 42 and the tool flank-face 43, by machining the diamond coating 2 covering the surface of the work 10 using the laser beam machining device 201 structured as above.

In the step of laser beam machining, as shown in FIG. 7, a plurality (9 layers in FIG. 7) of processing layers 25 are configured in a direction of a thickness of the rake-face side diamond coating 22 on the base rake-face 12.

An emission direction of the laser beam L is perpendicular to the processing layers 25 (that is, perpendicular to the surface of the rake-face side diamond coating 22); and a scanning direction of the laser beam L is a direction perpendicular to an extending direction of the base cutting-edge part 11 as shown by arrows in FIG. 1: by the laser beam L emitted in hatch-scanning with a constant rate and a regular intervals, removing a prescribed part of the diamond coating 2 in the respective processing layers 25, so that the tool rake-face 42 is machined and the tool cutting-edge part 41 is formed between the tool rake-face 42 and the tool flank-face 43.

As shown in FIG. 1, the intervals of the scanning lines on the tip of the cutting edge of the tool cutting-edge part 41 are constant, so that a density of the scanning lines of the laser beam L is higher in an inner part than in an outer part of the tool rake-face 42 (the base rake-face 12) in the edge shape protruding outward as the ball-end mil 101 shown in FIG. 1: accordingly, processing amounts is larger on the inner part of the tool rake-face 42 than on the cutting edge.
Accordingly, in order to make the density of the scanning lines constant from the inner part of the tool rake-face 42 to the cutting edge, lengths of the respective scanning lines may be adjusted.

In the respective processing layers 25, it is preferable that overlap K of the adjacent laser beam L be not less than 50% (refer to FIG. 9).
As shown in FIG. 9, where a condense diameter of the laser beam L is B and a center distance of the condense diameter B between the adjacent scanning lines of the the laser beam L is A; the overlap K is 0% when A=B, and the overlap K is 50% when A=(B/2).
It is possible to finish the machined surface to be an even smooth surface when the overlap K is not less than 50%.

The processing layers 25 is repeatedly scanned by the laser beam L, so that the prescribed parts of the rake-face side diamond coating 22 is removed and the three-dimensional machined surface is formed; eventually the tool flank-face 43 and the tool cutting-edge part 41 are formed with the tool rake-face 42 by machining the tool rake-face 42.

For example, as shown in FIG. 2, for forming the cutting-edge rake-face 44 and the tool cutting-edge part 41 with the height "h" of the cutting edge is less than 0 (h<0 mm) and the cutting-edge rake-angle θ is negative (θ<0°), stop positions of the respective scanning lines S1 of the laser beam L of the processing layers 25 are configured at outer part than the tip of the cutting edge of the planned tool cutting-edge part 41 to be processed, as the scanning lines are indicated by the solid arrows S1 in FIG. 7.

As shown in FIG. 7, in the diamond coating 2 formed to cover the surface of the tool base 1, the surface between the rake-face side diamond coating 22 and the flank-face side diamond coating 23 is an arc face.
Accordingly, as the laser beam L is emitted to the respective processing layers 25, a position of emitting the laser beam L is deeper in the vicinity of the cutting edge of the processing layers 25 than at the inner side of the tool center.
In other words, even if the scanning lines S1 are straight, the diamond coating 2 is removed along the arc surface in the part where the surface of the diamond coat 2 is the arc surface.

That is to say, since the emission length of the laser beam L is changed in the processing layers 25, the machined surface shape is machined large especially in the vicinity of the cutting edge.
Thereby the vicinity of the cutting edge can be machined deeper than in the other parts, it is possible to machine the cutting-edge rake-face 44 in which the cutting-edge rake-angle θ is negative and the tool cutting-edge part 41 in which the height "h" of the cutting edge is less than 0.

The cutting-edge rake-angle θ is preferably −20°<θ<−5°.
In order to control a dimension of the cutting-edge rake-angle θ, the stop position of the laser beam L in the respective hatch scanning is modified.
For example, as shown in FIG. 7, if the laser beam L is scanned as long as the outer side of the cutting edge for the all layers, the cutting-edge rake-angle θ is small (large in the negative side) owing to the roundness of the former diamond coating 2 at the cutting edge.

However, as shown in FIG. 8, when the laser beam L is scanned on the respective processing layers 25 with the scanning lines S1 (solid arrows) in combination with scanning lines S2 (broken arrows), it is possible to adjust the cutting-edge rake-angle θ to be large (a smaller value as an absolute value); where the scanning lines S1 have a scan-stop position at the outer side than the tip position of the cutting edge of the tool cutting-edge part 41 which is planned to be processed, and the scanning lines S2 have a scan-stop position at the inner side than the tip position of the cutting edge of the tool cutting-edge part 41 which is planned to be processed.

Here, regarding the scanning lines S2, which have the scan-stop position at the inner side than the tip position of the cutting edge of the tool cutting-edge part 41 which is planned to be processed, it is possible to form the smooth machined surface shape without steps with high accuracy by emitting with configuring the scan-stop positions on a curved line 46 shown by two-dotted line in FIG. 8 for example.

As described above, by adjusting the scan-stop positions of the scanning lines S1 and S2 of the laser beam L, it is easy to adjust energy density of the laser beam L emitted on the machined face: so it is easy to form the three-dimensional machined face (the cutting-edge rake-face 44) and the cutting edge in which the tip of the cutting edge is sharp can be formed, by removing the prescribed parts of the rake-face side diamond coating 22.

In FIG. 8, the scanning lines S1 having the scan-stop position at the outer side than the tip of the cutting edge of the tool cutting-edge part 41 and the scanning lines S2 having the scan-stop position at the inner side than the tip of the cutting edge of the tool cutting-edge part 41 are alternately performed: however, it is not limited to this.
It is possible to combine scanning timings and a number of times of the outer scanning lines S1 and the inner scanning lines S2 in accordance with the shape of the machined surface.

EXAMPLES

The ball-end mill (the double-flute ball-end mill with a diameter 2.0 mm) of the present embodiment was practically manufactured.
First, on a tool base, polycrystalline diamond coating with two-layer structure in which mean particle sizes were different was filmed by the hot filament CVD method at conditions shown in Table 1.
Material of the filament was tungsten of 99% by mass, and a diameter of the filament was 0.4 mm.
A distance between the tool base and the filament was maintained of 10 mm: the filament was stretched along a direction perpendicular to an axis direction of an end mill. Before the film formation, the filament was maintained 1500° C. for 2 hours by adjusting a gas pressure to 1 kPa, a flow rate of methane to 30 SCCM (1 atm, 0° C.), and a flow rate of hydrogen 3000 SCCM (1 atm, 0° C.); so that the filament was carbonized.

In addition, a unit of the flow rate of gas "SCCM" is a volume flow rate (cc/min) converted into a value under standard condition (1 atm, 0° C.).

For the film formation, temperature of the filament was adjusted so that temperature of the tool base be 800° C. to 900° C.

The temperature of the filament was controlled into a range in which the temperature of the tool base is 2100±50° C. in this time.

The temperature of the filament was measured by a radiation thermometer; the temperature of the tool base was measured by inserting thermocouple in the hard metal-based end mill from a shank side.

A film thickness and a layer thickness can be changed by adjusting film-formation time. Numbers 1 to 3 of condition indicate a first diamond layer; and numbers 4 to 10 indicate a second diamond layer as shown in Table 1.

Crystal grain diameters were controlled by changing gas conditions for forming films as shown in Table 1.

The average grain diameter shown in Table 1 is an arithmetical mean value defined by a mean value ((a+b)/2) of a length (a) in a perpendicular direction to the surface of the tool base and a length (b) in a parallel direction to the surface of the tool base regarding the individual diamond particles observed in a cross section of the coating.

The particle forms were defined as as "spherical" when the arithmetic mean value of a ratio (a/b) of the above-mentioned length (a) and the length (b) of the individual diamond particles were less than 1.5; or defined as "columnar" when it was not less than 1.5.

—Definition and Measuring Method of Mean Particle Diameter and Particle Form of Diamond Particles—

A thin test piece is made by slicing off the diamond coating on untreated part in the vicinity of the cutting edge of a target-tool in a parallel direction to a normal line to the tool base.

Regarding the thin test piece, obtained is one of a dark field image of TEM adjusted for enabling to distinguish outlines of individual particles or a color mapping image in which particles are color-classified in accordance with a crystal orientation obtained by EBSD measurement using a TEM probe.

On the image, line segments with a length of 3 μm parallel to a surface of the coating are perpendicularly drawn with an interval 0.5 μm toward a boundary face between the coating and the tool base from the surface of the coating: and the arithmetic mean value of the mean value ((a+b)/2) of the length (a) in the perpendicular direction to the surface of the tool base and the length (b) in the parallel direction to the surface of the tool base of all particles crossing the line segments is defined as a mean particle size at the position of the coating.

An aspect ratio of a particle at the position is defined by an arithmetic mean value of a value (a/b) dividing the length (a) in the perpendicular direction to the surface of the tool base by the length (b) in the parallel direction to the surface of the tool base.

It is judged a spherical particle when the aspect ratio is less than 1.5, or a columnar crystal particle when it is not less than 1.5.

The intensity ratio d/G is defined by a value of dividing the intensity "d" by the intensity "G", obtained as follows: regarding a cross section (the thin test piece) of the above-mentioned coating, Raman spectrum is measured with a light source of laser beam of a wavelength 532 nm and a diameter 0.5 μm: and read are the peak intensity "d" which is a sharp peak ($sp^3$ coupled band, a "d" band) appearing in the vicinity of 1330 $cm^{-1}$ after the wave-form separation; and the peak intensity "G" which is relatively a broad peak ($sp^2$ coupled band, a "G" band) appearing in the vicinity of 1580 $cm^{-1}$.

The measurement of the intensity ratio d/G is also performed with 0.5 mm intervals from the surface of the coating as above described.

TABLE 1

| | | | | Conditions of Film Formation | | | | Film |
| Condition No. | Mean Size (μm) | Particle Form | d/G | Total Pressure (kPa) | $CH_4$ Gas Flow Rate (SCCM) | $H_2$ Gas Flow Rate (SCCM) | $O_2$ Gas Flow Rate (SCCM) | Formation Rate (μm/h) |
|---|---|---|---|---|---|---|---|---|
| 1 | 0.01 | Spherical | 0.1 | 0.3 | 90 | 3000 | 0 | 1.5 |
| 2 | 0.05 | Spherical | 0.3 | 0.3 | 70 | 3000 | 0 | 1.5 |
| 3 | 0.13 | Spherical | 0.6 | 0.3 | 60 | 3000 | 0 | 1.5 |
| 4 | 0.15 | Columnar | 0.8 | 0.3 | 50 | 3000 | 0 | 1.5 |
| 5 | 0.3 | Columnar | 1.0 | 0.3 | 45 | 3000 | 0 | 1.3 |
| 6 | 0.7 | Columnar | 1.1 | 0.5 | 40 | 3000 | 0 | 1.5 |
| 7 | 1.5 | Columnar | 1.5 | 0.5 | 30 | 3000 | 0 | 1.5 |
| 8 | 3.7 | Columnar | 1.8 | 0.5 | 30 | 3000 | 0 | 2 |
| 9 | 4.4 | Columnar | 3.5 | 0.8 | 30 | 3000 | 5 | 1.3 |
| 10 | 5.2 | Columnar | 8.0 | 1.0 | 30 | 3000 | 10 | 1.2 |

Next, as shown in FIG. 1 and FIG. 7, laser beam was emitted perpendicularly on the rake face to hatch-scan repeatedly in a direction perpendicular to a ridge of the cutting edge with a constant rate and a regular intervals, so that the thickness of the diamond coating on the rake face was machined to be a prescribed thickness.

The condition of laser machining was as follows.

—Condition of Laser Machining—

Laser Wavelength: 355 nm
Pulse Width: 30 ns
Repetition Frequency: 200 kHz
Output: 0.5 W
Condense Diameter of Laser Beam: 10 μm
Scanning Rate of Laser Beam: 200 (mm/s)
Interval of Scanning Lines of Laser Beam (a center distance A): 2 μm Under the conditions of laser machining, the diamond coating was machined with a depth about 1 μm by one hatch-scanning.

By controlling the scanning lines as described above, the cutting-edge rake-angle θ was adjusted to be in a range of $-20° < \theta < -5°$.

The cross section of the cutting edge practically machined under the conditions of laser beam machining was exposed by FIB (Focused Ion Beam) machining and performed of SEM observation: every tools of Samples 1 to 30 (Examples) shown in Table 2 were extremely sharp having a radius curvature not more than 0.8 μm at the tip of the cutting edge (a corner part formed of the first diamond layer).

The radius curvature of the tip of the cutting edge described above is a radius in which a roundness of the tool cutting-edge part 41 was approximated by a circle. The cutting edge that is extremely sharp such as such is characteristic which can only be obtained in a case in which a pulse energy (fluence) of laser beam per unit area is in the vicinity of machining threshold value of the diamond coating as in the above described conditions of laser beam machining.

However, in a case in which the laser machining was performed with higher enough fluence than the machining threshold of the diamond coating (e.g., the output was 5 W in the above described condition), the radius curvature of the cutting edge after laser machining depends on the radius curvature before the machining, and is about a half of the radius curvature of the cutting edge before the machining (refer to Japanese Unexamined Patent Application, First Publication No. 2018-103338).

In any tool of Samples 1 to 13, the thickness d1 of the diamond coating on the rake face with 50 μm from the cutting edge or 1/10 of the tool diameter from the cutting edge was adjusted in a range not more than 5.0 μm.

The thickness d2 of the diamond coating on the flank face is a sum of the thickness of the first diamond layer and the thickness of the second diamond layer in Table 2.

As Comparative Examples, made were a tool of Sample 41 having a single-layered film of the second diamond layer for a case of the condition number 5 in Table 1 and a tool of Sample 42 in which the height "h" of the exposed boundary face was a positive value. Also in these Samples 40 and 41 of Comparative Examples, the film thickness d1 of the diamond coating on the rake face with 1/10 of the tool diameter from the cutting edge was adjusted in a range not more than 5.0 μm.

Table 2 shows the tools of those samples made by the above described method, with respect to the respective film thicknesses of the first diamond layer and the second diamond layer of the flank-face side diamond coating, the height "h" of the exposed boundary face and an actual measurement value of (L2/L1), and glossiness and a determination result thereof about the cutting workpiece after a cutting test.

The condition numbers in Table 2 correspond to the condition numbers in Table 1 showing the film formation conditions of the diamond coating and the like which were used for making samples.

Regarding the flank-face side diamond-coating in the tools of the respective samples, by measuring the mean particle size of the diamond particles from the surface of the coating with 0.5 μm interval, a thickness range satisfying the requirement for the first diamond layer (the mean particle size of the diamond particles is less than 0.15 μm) is determined as the first diamond layer.

It is the same for the second diamond layer (the mean particle size of the diamond particles is no less than 0.15 μm).

The cutting test was performed on a disc-shaped cutting workpiece made of hard metal (equivalent to ISO K10) with the mean particle size less than 1.0 μm, having a diameter 20 mm by using the respective tools in a dry process of surface grinding with cutting conditions of: 30,000 $\text{min}^{-1}$ of a rotation rate, 300 mm/min of a feed rate, a cut depth ae=0.03 mm (a machining width, a step amount in a width direction) and ap=0.05 mm (a machining depth).

When the disc-shaped cutting workpiece with the diameter 20 mm is grinded with a whole surface at the machining width ae=0.03 mm, a length of cutting is about 10 m.

After the cutting test, the glossiness of the cutting workpiece was measured and processing quality was determined. The glossiness shown in Table 2 is a mean value of four-measurements with rotating the cutting workpiece by every 90 degree with an incident angle 20 degree, by a gloss meter (PG-1M made by Nippon Denshoku Industries Co., LTD), regarding a region of 10.0 mm×10.6 mm on a center of the cutting workpiece.

The evaluation of the processing quality was determined regarding the mean value of the glossiness in comparison with the glossiness of the cutting workpiece by Sample 41 as a reference: it was determined as "A" if the glossiness of the cutting workpiece was twice or more than that by Sample 41, as "B" if it was 1 to 2 times, or as "C" if it is less than that.

TABLE 2

| | Tool Rake Angle [°] | Second Diamond Layer | | First Diamond Layer | | Height of Exposed Boundary Part h [μm] | L2/L1 | Glossiness [GU] | Determination |
|---|---|---|---|---|---|---|---|---|---|
| | | Condition No. | Thickness [μm] | Condition No. | Thickness [μm] | | | | |
| 1 | 15 | 5 | 5 | 1 | 3 | −0.2 | 2.5 | 601 | A |
| 2 | 15 | 5 | 5 | 1 | 6 | −0.5 | 5.1 | 623 | A |
| 3 | 15 | 5 | 5 | 1 | 10 | −0.1 | 8.5 | 395 | B |
| 4 | 15 | 5 | 10 | 1 | 3 | −0.5 | 2.2 | 578 | A |
| 5 | 15 | 5 | 10 | 1 | 3 | −2.5 | 3 | 610 | A |
| 6 | 15 | 5 | 10 | 1 | 6 | −0.1 | 4.4 | 661 | A |
| 7 | 15 | 5 | 10 | 1 | 6 | −2.7 | 6 | 560 | A |
| 8 | 15 | 5 | 10 | 1 | 10 | −0.4 | 7.4 | 411 | B |
| 9 | 15 | 5 | 15 | 1 | 3 | −0.2 | 2 | 570 | A |
| 10 | 15 | 5 | 15 | 1 | 6 | −0.2 | 4 | 652 | A |
| 11 | 15 | 5 | 15 | 1 | 10 | −0.3 | 6.6 | 501 | B |
| 12 | 25 | 5 | 2 | 1 | 1 | −0.5 | 1.5 | 371 | B |
| 13 | 25 | 5 | 5 | 1 | 3 | −0.1 | 2.1 | 612 | A |
| 14 | 25 | 5 | 5 | 1 | 6 | −0.3 | 4.1 | 695 | A |
| 15 | 25 | 5 | 5 | 1 | 10 | −0.4 | 6.9 | 523 | B |
| 16 | 25 | 5 | 10 | 1 | 3 | −0.2 | 1.6 | 494 | B |

TABLE 2-continued

| | Tool Rake Angle [°] | Second Diamond Layer Condition No. | Second Diamond Layer Thickness [μm] | First Diamond Layer Condition No. | First Diamond Layer Thickness [μm] | Height of Exposed Boundary Part h [μm] | L2/L1 | Glossiness [GU] | Determination |
|---|---|---|---|---|---|---|---|---|---|
| 17 | 25 | 5 | 10 | 1 | 3 | −4.3 | 3.1 | 642 | A |
| 18 | 25 | 5 | 10 | 1 | 6 | −4.5 | 6.1 | 554 | B |
| 19 | 25 | 5 | 15 | 1 | 3 | −0.2 | 1.3 | 412 | B |
| 20 | 25 | 5 | 15 | 1 | 6 | 0.2 | 2.5 | 580 | A |
| 21 | 25 | 5 | 15 | 1 | 10 | −0.3 | 4.2 | 663 | A |
| 22 | 25 | 5 | 15 | 1 | 10 | −6.5 | 10.2 | 335 | B |
| 23 | 35 | 5 | 5 | 1 | 3 | −0.1 | 16.4 | 399 | B |
| 24 | 35 | 5 | 5 | 1 | 3 | −2.9 | 3.3 | 599 | A |
| 25 | 35 | 5 | 5 | 1 | 10 | −0.4 | 3.6 | 632 | A |
| 26 | 35 | 5 | 5 | 1 | 10 | −2.7 | 7.2 | 398 | B |
| 27 | 35 | 5 | 10 | 1 | 6 | −0.5 | 1.6 | 401 | B |
| 28 | 35 | 5 | 10 | 1 | 6 | −5.8 | 4.5 | 604 | A |
| 29 | 35 | 5 | 10 | 1 | 10 | −0.2 | 2.5 | 578 | A |
| 30 | 35 | 5 | 10 | 1 | 10 | −6.1 | 7.2 | 388 | B |
| 41 | 25 | 5 | 15 | None | None | −0.3 | None | 280 | Reference |
| 42 | 25 | 5 | 15 | 1 | 6 | 1.5 | 2.1 | 225 | C |

As shown in Table 2, any cutting workpiece by the tool of Samples 1 to 30 was better in the glossiness than the cutting workpiece by the tool of Sample 41.
Especially, the cutting workpiece by the tool of Sample in a range of 2<(L2/L1)≤6 had the determination result "A".
Sample 42 is a case in which the height "h" of the exposed boundary face was a positive value: the glossiness of the cutting workpiece was worse than that by the tool of Sample 41, and the result was determined as "C".

FIG. 10 shows a graph of a relation between (L2/L1) and the glossiness of the cutting workpiece in Table 2.

It can be recognized that the glossiness of the cutting workpiece is good in the range 2<(L2/L1)≤6.

FIGS. 11A and 11B are SEM images of the cutting edge of the tool of Sample 17 (Example) before and after the cutting process: the symbol M17 indicates the cutting edge; and the symbol N17 indicates the rake face.
FIGS. 12A and 12B are SEM images of the cutting edge of the tool of Sample 41 (Comparative Example) before and after the cutting process: the symbol M41 indicates the cutting edge; and the symbol N41 indicates the rake face.
In Sample 17, it can be recognized from appearance that the minute particle layer (the width 3 μm) of the cutting edge is worn out, so that the coarse particles are the cutting edge. In Sample 17, a part of the cutting edge was chipped small: in Sample 41, it was chipped largely as shown in FIG. 12B. The thickness of the diamond coating on the rake face N17 is 2 μm in Sample 17: the thickness of the diamond coating on the rake face M17 is 0 μm (i.e., the base of hard metal is exposed) in Sample 41.

FIG. 13A is a photograph of the cutting workpiece after the cutting test by the tool of Sample 17: FIG. 13B is an SEM image around a center thereof (a length of the cutting about 5 m).
FIGS. 14A and 14B are a photograph of the cutting workpiece after the cutting test by the tool of Sample 41 and an SEM image around a center thereof (a length of the cutting about 5 m).
The cutting workpiece by the tool of Sample 17 was good in the glossiness of the machined surface, and traces of machining were almost not recognized even on the SEM image.

The cutting workpiece by the tool of Sample 41 was glossy in an initial stage of cutting (until about 2 m of the length of cutting) on the photograph: however, it can be found that the glossiness was deteriorated in subsequent cutting.
In FIG. 14A, the arrow A indicates a feeding direction of the tool and the arrow B indicates a pick feed direction.
As shown in FIG. 14B, stripe-shaped tool paths were clearly appeared in the SEM image, and a lot of dents with several μm of diameter, in which WC particles appeared to be teared off, were found.

Table 3 shows results of the cutting test with the same conditions as above mentioned, by making tools with the same tool shape and the coating thickness as those of Sample 17 but the crystal grain diameters (a condition of film formation) of the second diamond layer and the first diamond layer were different.
Sample 32 is on the same conditions as in the Sample 17.

TABLE 3

| | Tool Rake Angle [°] | Second Diamond Layer Condition No. | Second Diamond Layer Thickness [μm] | First Diamond Layer Condition No. | First Diamond Layer Thickness [μm] | Height of Exposed Boundary Part h [μm] | L2/L1 | Glossiness [GU] | Determination |
|---|---|---|---|---|---|---|---|---|---|
| 31 | 25 | 3 | 10 | 1 | 3 | −4.2 | 3.1 | 283 | C |
| 32 | 25 | 5 | 10 | 1 | 3 | −4.3 | 3.1 | 642 | A |
| 33 | 25 | 10 | 10 | 1 | 3 | −4.3 | 3.1 | 442 | B |
| 34 | 25 | 5 | 10 | 2 | 3 | −4 | 3 | 355 | B |
| 35 | 25 | 4 | 10 | 3 | 3 | −4.3 | 3.1 | 332 | B |

TABLE 3-continued

| Tool Rake Angle [°] | Second Diamond Layer Condition No. | Second Diamond Layer Thickness [μm] | First Diamond Layer Condition No. | First Diamond Layer Thickness [μm] | Height of Exposed Boundary Part h [μm] | L2/L1 | Glossiness [GU] | Determination |
|---|---|---|---|---|---|---|---|---|
| 36 | 25 | 8 | 10 | 3 | 3 | −4.2 | 3.1 | 630 | A |
| 37 | 25 | 10 | 10 | 3 | 3 | −4.5 | 3.3 | 625 | A |
| 38 | 25 | 8 | 10 | 4 | 3 | −4.4 | 3.3 | 221 | C |

As shown in Table 3, the glossiness of the cutting workpiece was low in Sample 31 in which the mean particle size of the second diamond layer was less than 0.15 μm and in Sample 38 in which the mean particle size of the first diamond layer was not less than 0.15 μm, the determination was "C": others were good in the glossiness of the cutting workpiece, the determination were "A" or "B".

As explained above, since the coating thickness was not more than 5.0 μm on the tool rake-face 50 μm from the tip of the base cutting-edge part, it was possible to prevent peeling.

In this case, even if the thickness of the diamond coating was zero on the tool rake face (that is, even if it was completely removed), any damage resulting from a chip flow was not found on the exposed base of the base rake-face.

As described above, in the tools of the present embodiment, damages resulting from peeling or chipping were not generated and it was possible to obtain a flat and smooth machined face.

The present invention is not limited to the above-described embodiment and various modifications may be made without departing from the scope of the present invention.

For example, the first diamond layer and the second diamond layer may have a lamination structure in which the particle size of the diamond particles and the like vary intermittently or successively in the respective regions, if in the required ranges for determining the regions of those (that is, in ranges in which the layers can be distinguished): moreover, it is not necessary that the crystal grains are relatively minute at a surface side of the coating.

For example, the first diamond layer may have a lamination structure in which the particles vary minute to super-minute from the surface side toward the base.

Moreover, regarding the boundary between the first diamond layer and the second diamond layer, a clear (discontinuous) boundary is not always necessary; the crystal grain diameter may successively vary, for example.

Moreover, doped elements of nitride or boron can be used for the diamond coating.

For the tool of the present embodiment, it is not necessary for the whole diamond coating to have a double structure of the first diamond layer and the second diamond layer. Regarding the rake face at a part separated than a feeding amount (generally, about 5 μm when the cutting workpiece is hard metal) per one edge by a standard cutting condition of the tool from the tip of the cutting edge; there is no direct contact with the cutting workpiece, minute chips slide on the surface, so that almost no frictional wear occurs: accordingly, it may be a single-layered structure only of the first diamond layer made of minute diamond particles, for example.

Moreover, it can be a multi-layered structure in which the second diamond layers made of the coarse diamond particles and the first diamond layers made of the minute diamond particles are alternately layered.

In this case, in accordance with the size of the thickness d1 of the diamond coating on the rake face, the diamond layer on the surface layer of the rake face is not always the second diamond layer (a layer made of the coarse diamond particles), and may be the first diamond layer (a layer made of the minute diamond particles), for example.

After laser machining on the above-mentioned rake face, the diamond coating (the first diamond layer) at the tip of the cutting edge may be chamfered by substantially a plane having an angle of relief being zero substantially using laser machining, grinding or the like.

By chamfering previously, a difference of the tool diameter between an initial stage and a middle or later stage of the cutting is reduced, so that machining accuracy can be improved.

Although the ball-end mill is explained in the above-mentioned embodiment, the present invention can be applicable on rotary cutting tools having a diamond coating on a surface of a tool base, for example, cutting tools such as a drill in which a cutting edge is formed integrally, the other end mills, inserts and the like.

Also in those cutting tools, various structures can be applicable such as a curved cutting-edge part, a combination of a curved cutting-edge part and a straight cutting-edge part, and the like.

In addition, regarding the first diamond layer and the second diamond layer, it is not necessary to satisfy the above-mentioned required ranges concurrently for all of the mean particle sizes and the aspect ratios of the diamond particles in the respective layers and the intensity ratios of the Raman spectrum.

As comparison between the respective layers, it is sufficient that the diamond particles of the second diamond layer are larger than the diamond particles of the first diamond layer: it is sufficient that the mean particle sizes, the aspect ratios, and spectrum intensity ratios satisfy preferable ranges respectively as required.

INDUSTRIAL APPLICABILITY

In a cutting process, it is possible to prevent defects from occurring resulting from peeling or chipping of a cutting edge of a cutting tool, and a flat and smooth machined surface can be obtained.

REFERENCE SIGNS LIST

1 Tool base
2 Diamond coating
3 Tool-tip part
11 Base cutting-edge part
12 Base rake-face
13 Base flank-face 22 Rake-face side diamond coating
23 Flank-face side diamond coating
25 Processing layer
31 First diamond layer
32 Second diamond layer
41 Tool cutting-edge part
42 Tool rake-face
43 Tool flank-face
44 Cutting-edge rake-face
45 Cutting-edge flank-face
50 Laser beam emission system
51 Laser oscillator
52 Condense lens
53 Beam scanning system
54 Photographing part
60 Tool holder system
61x x-axis stage part
61y y-axis stage part
61z z-axis stage part
62 Rotation system
63 Holder
64 Revolving system
70 Control system
101 Ball-end mill (Diamond-coated rotary cutting tool)
201 Laser beam machining device

The invention claimed is:

1. A diamond-coated rotary cutting tool comprising a tool base made of hard metal and a diamond coating covering the surface thereof, wherein
the tool base is provided with a base rake-face, a base flank-face, and a base cutting-edge part provided on a ridge in which the base rake-face and the base flank-face cross,
the diamond coating forms: a flank-face side diamond coating, comprising a first diamond layer made of nanodiamond particles and a second diamond layer made of diamond particles which are larger than the diamond particles of the first diamond layer, wherein the flank-face side diamond coating covers a surface of the base flank-face and has a mean coat thickness d2 not less than 3 µm and not more than 25 µm; and a rake-face side diamond coating covering at least a prescribed region of the base rake-face, wherein a mean coat thickness d1 is a thickness of a smaller range of one of a range not less than 0 µm and not more than 5.0 µm or a range less than the mean coat thickness d2,
the flank-face side diamond coating is provided with the first diamond layer forming a surface thereof and the second diamond layer adjacent to the first diamond layer at a tool-base side,
the rake-face side diamond coating is provided on the prescribed region that is at least smaller one of a region 50 µm or 1/10 of a tool diameter from the base cutting-edge part of the base rake-face,
the diamond-coated rotary cutting tool is provided with a tool rake-face formed by a surface of the rake-face side diamond coating or a surface of the base rake-face and a following end surface of the flank-face side diamond coating; a tool flank-face formed by the surface of the flank-face side diamond coating; and a tool cutting-edge part formed at a ridge where the tool rake-face and the tool flank-face crosses, and
in a perpendicular cross section of the base cutting-edge part, where a straight line connecting a tool-rotation axis and the base cutting-edge part is a base line, a boundary part between the first diamond layer and the second diamond layer at the end surface of the flank-face side diamond coating is exposed at a side nearer to the base flank-face than an extended line of the base line,
wherein
on a perpendicular line to the base line at a position of 1 µm in a parallel direction to the base line from the boundary part to the tool base side, a ratio (L2/L1) of a length L1 of the second diamond layer and a length L2 of the first diamond layer satisfies 2≤(L2/L1)≤6.

2. The diamond-coated rotary cutting tool according to claim 1, wherein
a mean particle size of diamond particles of the first diamond layer is less than 0.15 µm; and
a mean particle size of diamond particles of the second diamond layer is not less than 0.15 µm.

3. The diamond-coated rotary cutting tool according to claim 1, wherein
a length ratio (a/b) is a rate of lengths (a) and (b) of the respective diamond particles observed on a cross section perpendicular to the surface of the tool base, where: the length (a) is along a perpendicular direction to the surface of the tool base, and the length (b) is along a parallel direction to the surface of the tool base,
the length ratio (a/b) of the diamond particles of the first diamond layer is less than 1.5, and
the length ratio (a/b) of the diamond particles of the second diamond layer is not less than 1.5.

4. The diamond-coated rotary cutting tool according to claim 1, wherein
in a wave-form separation of Raman spectrum on a cross section of the diamond coating perpendicular to the surface of the tool base, an intensity (d) is a peak (d band) coming from a $sp^3$ hybrid orbital of diamond existing around 1332 $cm^{-1}$, and an intensity (G) is a peak (G band) coming from a sp3 hybrid orbital of graphite existing around 1580 $cm^{-1}$, and wherein
an intensity ratio (d/G) of the first diamond layer satisfies 0.1≤(d/G)≤0.8, and
the intensity ratio (d/G) of the second diamond layer satisfies 0.8≤(d/G).

* * * * *